United States Patent [19]

Matsumoto

[11] Patent Number: 5,345,102
[45] Date of Patent: Sep. 6, 1994

[54] BIPOLAR TRANSISTOR HAVING COLLECTOR ELECTRODE PENETRATING EMITTER AND BASE REGIONS

[75] Inventor: Naoya Matsumoto, Tokyo, Japan

[73] Assignee: NEC Corporation, Tokyo, Japan

[21] Appl. No.: 22,621

[22] Filed: Feb. 25, 1993

[30] Foreign Application Priority Data

Feb. 28, 1992 [JP] Japan .................................. 4-042702

[51] Int. Cl.⁵ ................... H01L 27/082; H01L 29/40; H01L 29/70
[52] U.S. Cl. ................................. 257/588; 257/586; 257/587; 257/593
[58] Field of Search ............... 257/586, 587, 588, 565, 257/591, 592, 593, 553, 554, 555, 556, 370, 557

[56] References Cited

U.S. PATENT DOCUMENTS 4,492,008 1/1985 Anantha et al. ..................... 257/511
4,963,957 10/1990 Ohi et al. ............................ 257/557

Primary Examiner—Rolf Hille
Assistant Examiner—Wael Fahmy
Attorney, Agent, or Firm—Sughrue, Mion, Zinn, Macpeak & Seas

[57] ABSTRACT

A bipolar transistor with a trench. The trench extends down into a buried collector region through an emitter region, the underlying intrinsic base and collector regions at their center portion. Insulating films are formed on the sidewalls of the trench. The trench is filled with a collector-connection conductor which contacts with the buried collector region.

12 Claims, 4 Drawing Sheets

BIPOLAR TRANSISTOR HAVING COLLECTOR ELECTRODE PENETRATING EMITTER AND BASE REGIONS

BACKGROUND OF THE INVENTION

1. Field of the Invention

This invention relates to a bipolar transistor, and more particularly to a bipolar transistor with an improved integration and a reduced emitter-base parasitic capacitance.

2. Description of the Related Art

For the purpose of realizing higher integration density and increased speed operation, various types of bipolar transistors have been proposed. For example, U.S. Pat. No. 4,963,957 issued on Oct. 16, 1990 disclosed a process of forming self-aligned emitter and graft base regions, and bringing a collector connection conductor in direct contact with the buried n+ collector layer. This is distinguished from conventional bipolar transistors in which the buired n+ collector is in contact with a conductive layer of low resistivity buried in a trench provided in a semiconductor substrate. With this structure, the collector resistance is reduced, and the operation speed of the bipolar transistor is increased accordingly.

This prior art, however, paid no regard to the current distribution in the emitter region and had no concern with the location of the collector connection with respect to the emitter region. For this reason, the to reduction in the emitter-base parasitic capacitance is restricted to thereby lower an operation speed, and improvement in integration is also restricted.

SUMMARY OF THE INVENTION

It is therefore an object of the present invention to provide a bipolar transistor having an improved structure, particularly in the location of the collector-connection part with respect to the emitter region, and thus permitting higher levels of integration and increased speed performance.

A bipolar transistor according to the present invention comprising: a semiconductor substrate; a collector region of one conductivity type formed in the semiconductor substrate; a buired collector region of the one-conductivity type formed in contact with the collector region and having a higher impurity concentration than the collector region; an intrinsic base region of the opposite-conductivity type formed in the collector region; a graft base region of the opposite-conductivity type formed to surround the intrinsic base region and having a higher impurity concentration than the intrinsic base region; an emitter region of the one-conductivity type formed in the intrinsic base region; a trench formed to penetrate the emitter region, the intrinsic base region and the collector region and reach the buried collector region; and a collector lead-out conductor filling the trench with isolation from the intrinsic base region and the emitter region and with a contact with the buried collector region.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

EXPLANATION OF THE PRIOR ART

Figure 1A:
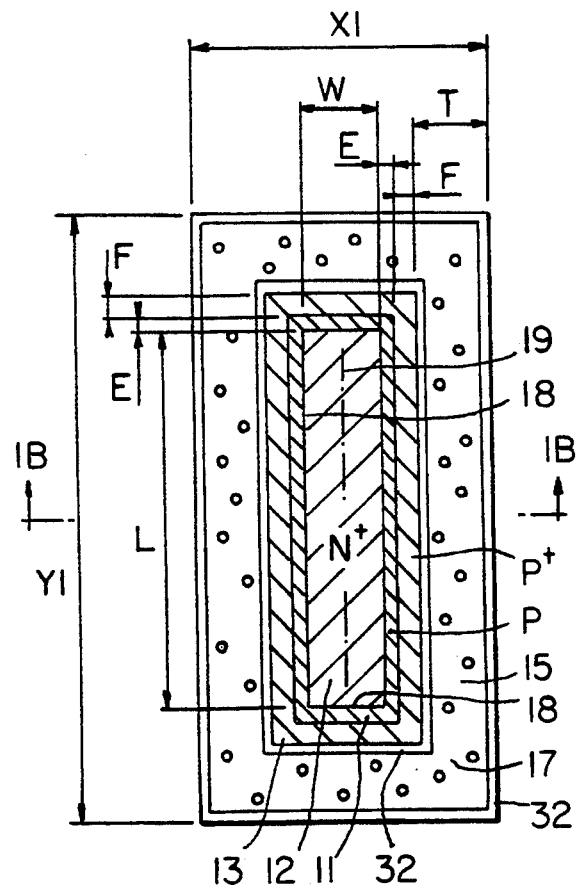
FIG. 1A is a plan view of a bipolar transistor in the prior art.
Figure 1B:
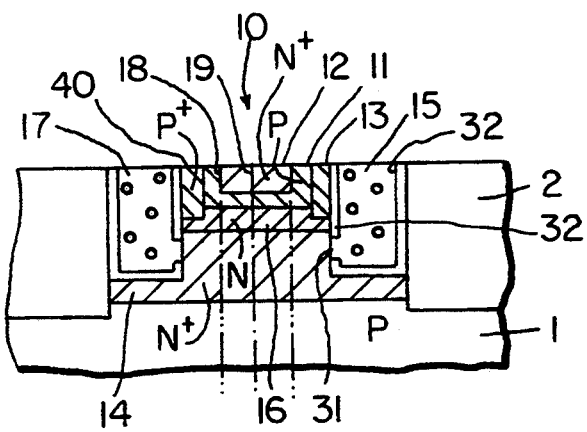
FIG. 1B is a cross-sectional view taken along line A—A' of FIG. 1A when viewed in the direction of arrows.

Referring to FIGS. 1A and 1B, the bipolar transistor in the prior art will be described below. At the surface of p-type silicon substrate 1, a buried n+ collector layer 14 and thereon an n-type collector region 16 are formed. On top of this further a U-shaped-in-section p-type intrinsic base region 11 with inside which n+ emitter region 12 is enclosed is formed, and then a ring-shaped p+graft base region 13 is formed to surround p-type intrinsic base region 11. There is further formed a ring-shaped trench 15 surrounding p+ graft base region, which extends into the buried n+ collector layer 14 and has insulating films 32 grown on the side walls. The trench 15 is filled with a conductor 17 serving as a collector connection which contacts, through a selectively-cut opening 31 in insulating film 32, with buried n+ collector layer 14.

Referring to FIG. 1A, the dimensions of the above-mentioned bipolar transistor will be exemplified in the following: Assuming that W=1.0 μm and L=5 μm, the emitter region 12 measures 5.0 μm² in area (W×L). It is surrounded by a p-type graft base region 11 (width E=0.2 μm) which is surrounded with by a p+ graft base region 11 (width F=0.3 μm) which further is surrounded with by trench 15 (width T=1.0 μm). Accordingly the area of a bipolar transistor region 10 isolated by device-isolating regions such as field oxide films: $X_1 \times Y_1$ is 32.0 μm² where $X_1 = W + 2 \times (E + F + T) = 4.0$ μm and $Y_1 = L + 2 \times (E + F + T) = 8.0$ μm. The circumference 18 of emitter region 12: 2×(L+W) measures 12 μm.

Figure 1C:
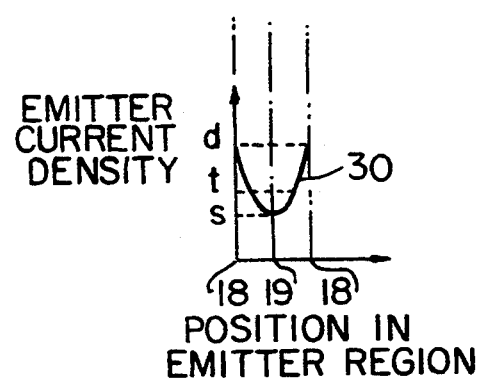
FIG. 1C is a graph showing the distribution of the emitter current in the emitter region along line A—A' of FIG. 1A.

In FIG. 1C, curve 30 shows the change in emitter current density along the cross-section line: When formed shallowly to obtain good high frequency properties of the transistor, p-type intrinsic base region 11 measures a very great layer resistance. Because of voltage fall due to the layer resistance, the emitter current density becomes minimum "s" at the center 19 of emitter region 11. With going bilaterally, the emitter current increases, and concentrates on the boundary 18 of emitter region 12, that is the nearest to p+ graft base region 13, where the emitter base potential is the greatest (emitter crowed effect), thus reaching maximum "d". Besides, the distance between the boundary 18 and the center 19 is 0.5 μm, and emitter current density "t" is at 0.3 μm distant from the boundaries 18.

Because of exponential decrease of the emitter current density with going from the boundary 18 to the center 19, the center 19 and the vicinity are not only substantially unuseful but also the parasitic capacitance of the emitter-base junction interferes with high speed operation of bipolar transistor.

DETAILED DESCRIPTION OF THE PREFERRED EMBODIMENTS

Figure 2A:
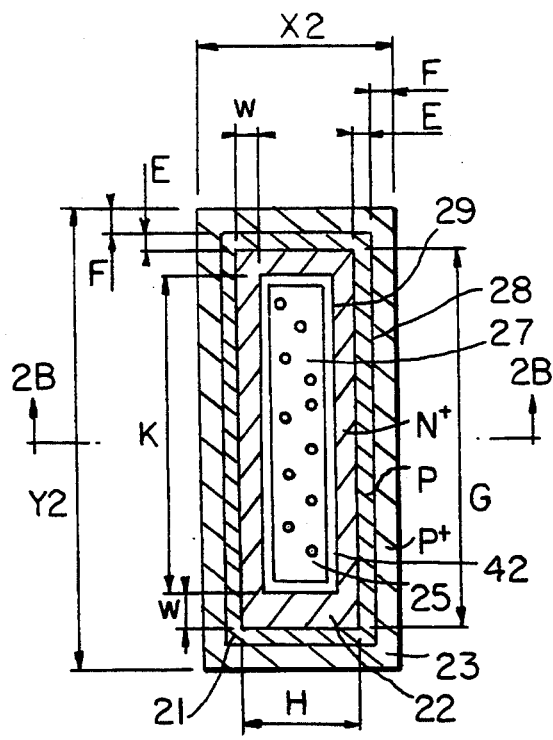
FIG. 2A is a plan view of the bipolar transistor as an embodiment of the present invention.
Figure 2B:
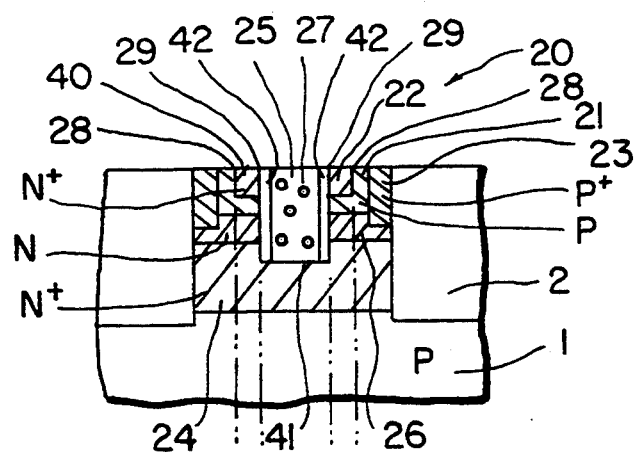
FIG. 2B is a cross-sectional view taken along line B—B' of FIG. 2A when viewed in the direction of arrows.
Figure 2C:
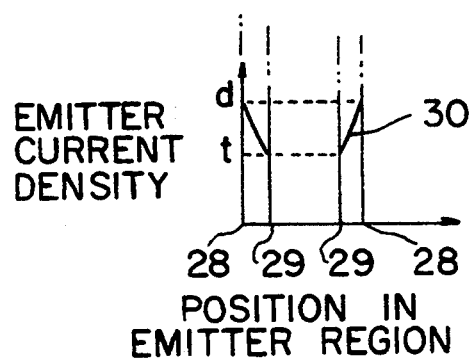
FIG. 2C is a graph showing the distribution of the emitter current in the emitter region along line B—B' of FIG. 2A.

Referring to FIGS. 2A, 2B and 2C, an embodiment of the present invention will be set forth in comparison with the prior art shown in FIGS. 1A, 1B and 1C. Like FIGS. 1A and 1B, for convenience, FIGS. 2A and 2B do not show the part including electrodes and interconnections over the transistor structure.

At the surface of a p-type silicon substrate 1, a buried n+ collector layer 24 and thereon an n-type collector region 26 are formed. A U-shaped-in section p-type intrinsic base region 21, inside which n+ emitter region 22 is enclosed, is formed to be surrounded by a ring-shaped p+ graft base region 23. The transistor structure is isolated by field oxide films 2 surrounding p+ graft base region 23.

In this embodiment, a trench 25 which extends through emitter region 22 and the underlying intrinsic base layer 21 and collector layer 26 into buried collector layer 24 is formed 0.3 μm distant from the boundary 28 of emitter region 22, that is, to be surrounded by the resultant ring-formed emitter region of 0.3 μm (W) wide. An insulating film 42 is formed over the entire sidewall of the trench 25 to isolate electrically from intrinsic base region 21 and emitter region 22, and then trench 25 is filled with conductor 27 which contacts at the trench bottom 41 with buried collector region 24.

Referring to FIG. 2A, the dimensions of bipolar transistor of this embodiment are exemplified:

Trench 25: T=1.0 μm, K=4.4 μm. Emitter region 22: as outward dimensions H=1.6 μm, G=5.0 μm, w=0.3 μm; Accordingly area of emitter region=H×G−T×K=3.6 μm2.

In the same manner as in FIG. 1A, emitter region 22 is surrounded by p-type intrinsic base region 21 having a width (E) of 0.2 μm, which is surrounded by p+ graft base region 23 having a width (F) of 0.3 μm. The thus-fabricated bipolar transistor region 20 which is defined by the periphery of the graft base region 23 or device-isolation regions 2 as of field oxide film has an area: X2×Y2=15.6 μm2, where X2=H+2×(E+F)=2.6 μm and Y=G+2×(E+F)=6.0 μm.

Emitter region 22, which is opposite to graft base region 23, has an outside circumference (=2×(G+H)) of 13.2 μm.

The are occupied by the bipolar transistor of this embodiment results in reduction of 49% (15.6/32.0=0.49), compared with that of FIGS. 1A, 1B and 1C in the prior art, and this permits to fabricate higher level-integrated bipolar ICs. The area of emitter region reduces to 3.6/5.0=0.72=72%, and therefore, assuming that the regions of both transistors have the same concentration of impurity dopants, the parasitic capacitance between the emitter and base reduces to 72%, too, which permits increased speed of operation.

The emitter region reduces to 72% in area while its outside circumference opposite to graft base region 23 increases 10% ((13.2−12.0)/12.0). This increase, as understood from the current density distribution 30 in FIG. 2C, is of the limited range of current density to "d" to "t" containing maximum emitter current density due to emitter crowd effect, and hence contributes to obtaining emitter current equivalent to or more than that of FIG. 1 at the same voltage applied.

It is preferable for various bipolar transistors to set the width (W) between inside and outside circumferences of the emitter region to at least 0.2 μm because thereby the emitter crowd effect can be well used to obtain an advantageous current-density distribution for the emitter region. On the other hand, though the upper limit is set, collectively taking the emitter crowd effect, the area and current capacitance of the transistor, etc. into consideration, at any rate the application of the transistor structure with a trench, which serves as a collector connection, extending through the emitter region can provide the above-mentioned effect.

Figure 3A:
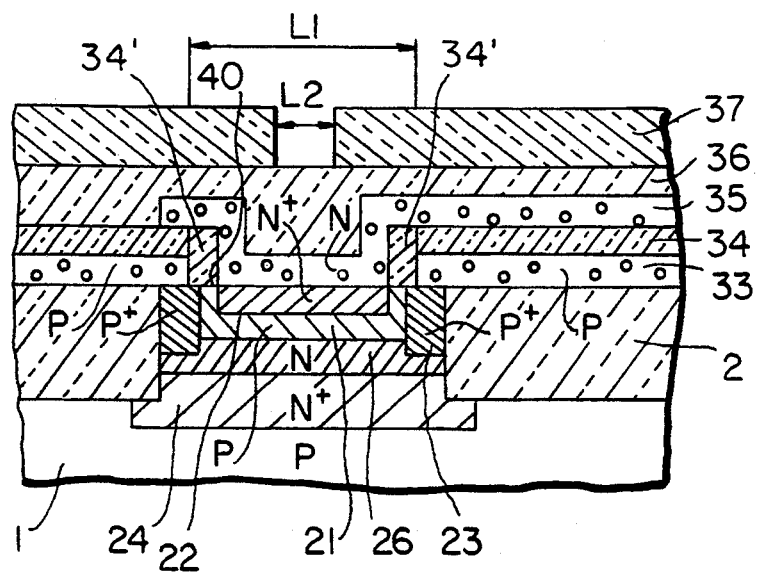
FIGS. 3A through 3C are cross-sectional views showing the fabrication process sequence of the bipolar transistor of the embodiment of the present invention.
Figure 3B:
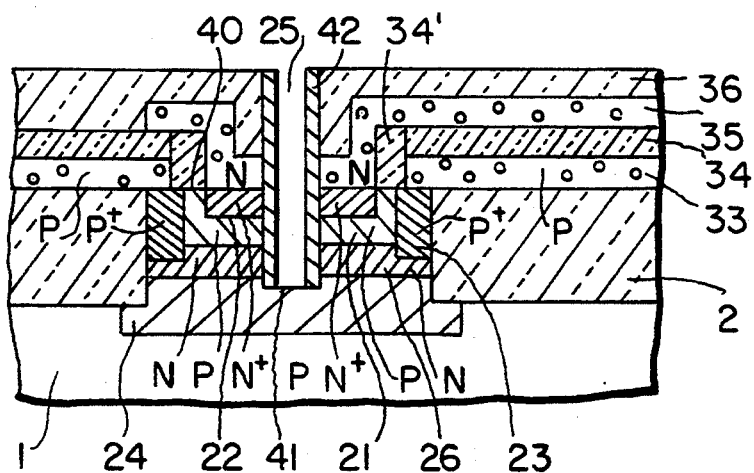
Figure 3C:
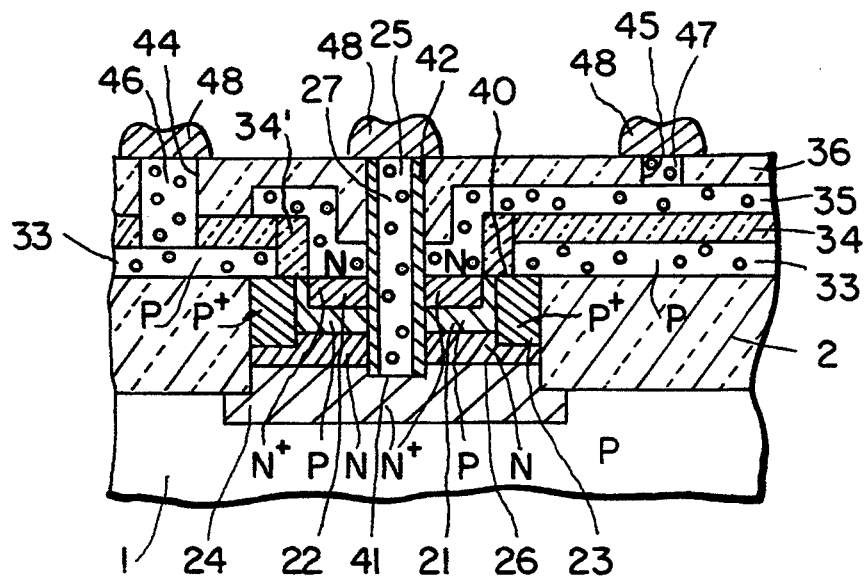

Referring to FIGS. 3A to 3C, the embodiment of the present invention is fabricated according to the process sequence which will be described under At the surface of a p-type single crystal silicon substrate 1 is formed a buried n+ collector layer 24 and thereon a n-type single crystal silicon layer is grown by the epitaxial technique. To isolate a transistor area 20, field silicon oxide films 2 are formed on the surface of p-type silicon substrate 1 by the local thermal oxidation technique. Over the resultant surface 40 is formed a p-type polysilicon film 33, on which a first dielectric (silicon oxide) layer 34 is formed. These layers are selectively etched by photolithography to cut an opening L1 with their parts left to somewhat project in the transistor area 20, thus to expose partially the silicon layer of the transistor area 20. Ion implantation with boron and subsequent annealing at 900° to 1000° C. are carried out with the result of producing a p-type intrinsic base region 21 of $2\times 10^{18}/cm^3$ in impurity concentration and, between this and buried n+ collector region, an n-type collector 26. During the annealing, boron diffuses into the silicon layer from the projected portion of p-type polysilicon film 33 to form a self-aligned graft base region 23 of $1\times 10^{20}/cm^3$ or more in impurity concentration. Over the top, a silicon oxide film is deposited and etched back by anisotropic dry etching to form sidewalls 34' at the edges of p-type polysilicon film 33 and silicon oxide film 34. After depositing an n-type polysilicon film 35, n-type impurity such as phosphorus or arsenic in n-type polysilicon film 35 is diffused by thermal treatment into the portion of p-type intrinsic base region 21 defined by the sidewalls 34' sectioned from p+ graft base region 23, thus to form there a self-aligned n+ emitter region 22 of $1\times 10^{20}/cm^3$ in impurity concentration. n-type polysilicon film 35 is selectively etched to be shaped into emitter connection layer 35. After a PSG film 35 as the second dielectric layer is deposited over and then planarized, a resist film 37 is coated cover, followed by patterning, and an opening L2 is formed in it. The state at this process stage shown in FIG. 3A.

Subsequently, as shown in FIG. 3B, anisotropic dry etching is carried out using a resist 37 as mask to form a trench 25 extending into buried n+ collector layer 24 through in sequence a PSG film 36, n-type polysilicon film 35, n+ emitter region 22, p-type base region 21, and n-type collector region 26. A silicon nitride film of 50 to 100 nm thick is deposited and etched back by anisotropic dry etching to leave silicon nitride layer 42 on the sidewalls of trench 25. Then silicon nitride film is removed in the area of the trench bottom 41 through which buried n+ collector layer 24 is exposed.

Further as shown in FIG. 3C, a through-hole 44 reaching p-type polysilicon film 33 as base connection layer through PSG film 36 and silicon oxide film 34 is formed, and another through-hole 45 reaching n-type polysilicon film 35 as emitter connection layer through PSG film 36 is formed. After filling trench 25 and through-holes 44, 45 with tungsten by CVD technique, and then etched back to form collector-connection conductor 27, or collector electrode, in trench 25, base electrode 46 in through-hole 44, and emitter electrode 47 in through-hole 45. To each of these tungsten electrodes, a metal wiring layer 48 is connected. An n-type polysilicon of high impurity concentration may be used in the place of tungsten used above.

Figure 4:
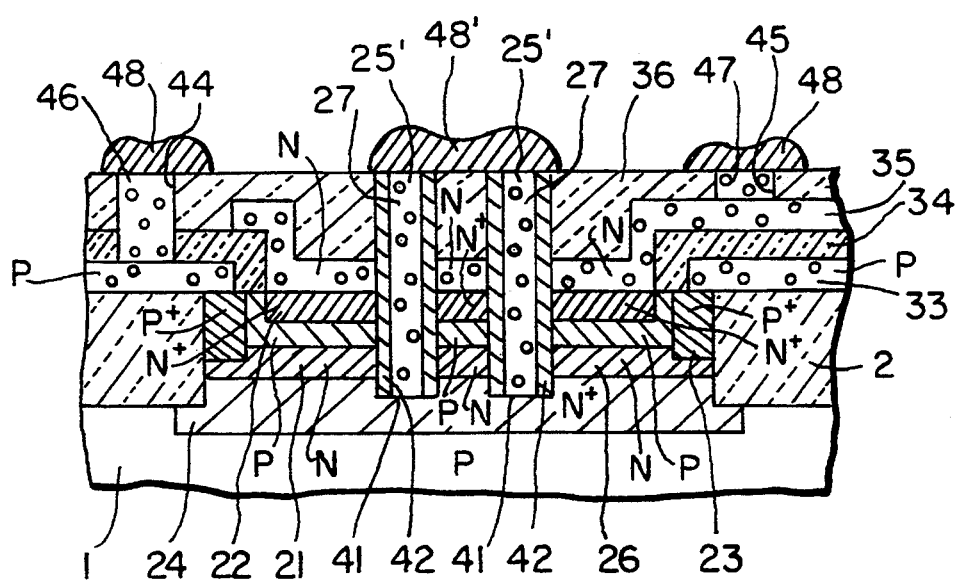
FIG. 4 is a cross-sectional view of the bipolar transistor of an alternative embodiment of the present invention.

FIG. 4 illustrates an alternative of the above-described embodiment, and uses the same reference characters as those in FIG. 3 to designate the corresponding components to those in FIG. 3, therefore their description being omitted.

Bipolar transistors having large emitter area for driving large current inevitably needs large area for collector part. A large area of collector-connection trench requires an extremely thick tungsten film, this making it difficult to fill with tungsten by CVD.

For a large-area collector part, therefore, the structure of FIG. 4 may be used which is provided with a plurality of trenches 25' filled with collector-connection conductor 27 which are connected together with metal wiring layer 48'.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A bipolar transistor comprising:
   a semiconductor substrate;
   a buried collector region formed in said semiconductor substrate;
   a collector region formed on said buried collector region;
   an intrinsic base region formed on said collector region;
   a graft base region formed to surround said intrinsic base region and having an impurity concentration higher than said intrinsic base region;
   an emitter region formed in said intrinsic base region;
   a trench formed to penetrate into said emitter region and to reach said buried collector region through said intrinsic base region and said collector region; and
   a collector electrode filling said trench with an electrical isolation from said intrinsic base region and said emitter region, said collector electrode being in contact with said buried collector region.

2. A bipolar transistor as claimed in claim 1, wherein said graft base region is connected to a base electrode layer and said emitter region is connected to an emitter electrode layer.

3. A bipolar transistor as claimed in claim 2, wherein a first insulating film is formed between said base electrode layer and said emitter electrode layer and a second insulating film is formed on said emitter electrode layer.

4. A bipolar transistor as claimed in claim 3, wherein a hole is provided to penetrate said emitter electrode layer and said second insulating film and reaches said trench, said collector electrode being elongated through said hole with an isolation from said emitter electrode layer.

5. A bipolar transistor as claimed in claim 1, wherein said graft base region is surrounded by a field insulating film.

6. A bipolar transistor as claimed in claim 1, wherein said collector region is epitaxially grown on a semiconductor layer of a conductivity type opposite to said collector region and said buried collector region is formed between said collector region and said semiconductor layer.

7. A bipolar transistor as claimed in claim 6, wherein said semiconductor layer is made of single-crystal silicon, and said collector region is of a single-crystal silicon layer epitaxially grown on said semiconductor layer.

8. A bipolar transistor as claimed in claim 1, wherein a plurality of trenches extending into said buried collector region through the center portion of said emitter region are formed, each trench being provided with an insulating film thereon and filled with a collector electrode.

9. A bipolar transistor as claimed in claim 1, wherein said collector electrode is made of a refractory metal.

10. A bipolar transistor as claimed in claim 9, wherein said refractory metal is tungsten.

11. A bipolar transistor as claimed in claim 1, wherein said collector electrode is made of polycrystalline silicon.

12. A bipolar transistor as claimed in claim 1, wherein said collector region and said graft base region are surrounded by a field insulating film.

* * * * *